United States Patent
Tomasini et al.

[11] Patent Number: 5,825,250
[45] Date of Patent: Oct. 20, 1998

[54] OPERATIONAL AMPLIFIER HAVING AN ADJUSTABLE FREQUENCY COMPENSATION

[75] Inventors: Luciano Tomasini, Acqaui Terme; Rinaldo Castello, Arcore; Giancarlo Clerici, Vimodrone; Ivan Bietti, Casal Romano, all of Italy

[73] Assignee: SGS-Thomson Microelectronics S.r.l., Brianza, Italy

[21] Appl. No.: 757,384

[22] Filed: Nov. 27, 1996

[30] Foreign Application Priority Data

Nov. 30, 1995 [EP] European Pat. Off. .............. 95830500

[51] Int. Cl.$^6$ ...................................................... H03F 1/14
[52] U.S. Cl. ............................................. 330/292; 330/294
[58] Field of Search .............................. 330/51, 109, 291, 330/292, 294

[56] References Cited

U.S. PATENT DOCUMENTS

| | | | |
|---|---|---|---|
| 4,500,846 | 2/1985 | Lewyn et al. | 330/294 X |
| 5,140,279 | 8/1992 | Scott | 330/294 X |
| 5,363,055 | 11/1994 | Ribner | 330/294 X |

FOREIGN PATENT DOCUMENTS 8404421  11/1984  WIPO.

OTHER PUBLICATIONS

IEEE Transactions on Circuits and Systems, vol. 38, No. 10, Oct. 1991, NY, U.S., pp. 1212–1217, XP000278320, D. J. Allstot W.C. Black.: "A Substance–Referenced Data–Conversion Archtitcture.".

Primary Examiner—Steven Mottola
Attorney, Agent, or Firm—Jenkens & Gilchrist; Michele A. Mobley

[57] ABSTRACT

An integrated operational amplifier with adjustable frequency compensation having a transconductance input stage and an amplifier output stage connected serially together between an input terminal and an output terminal of the operational amplifier. For the purpose of frequency compensation, moreover, a compensation block is connected across the input and the output of the output stage. The compensation block uses a plurality of charge storage elements connected in parallel together and in series with switch block which selects a sub-plurality of said charge storage elements in response to an external signal of the amplifier. The compensation block thereby provides an overall effective capacitance for frequency compensation.

22 Claims, 4 Drawing Sheets

OPERATIONAL AMPLIFIER HAVING AN ADJUSTABLE FREQUENCY COMPENSATION

CROSS-REFERENCE TO RELATED APPLICATION

This application claims priority from European 95830500.5, filed Nov. 30, 1995, which is hereby incorporated by reference.

BACKGROUND AND SUMMARY OF THE INVENTION

This application relates to an operational amplifier with adjustable frequency compensation, particularly with respect to closed-loop gain.

The operational amplifier is of the type which comprises a transconductance input stage and an amplifier output stage connected serially with each other to receive an input signal on at least one input terminal of the amplifier and generate an amplified signal on an output terminal of the amplifier. A compensation block is also provided across the output and the input of the output stage for frequency compensation purposes.

Reference is made herein, by way of example and not of limitation, to non-predetermined-gain systems wherein the operational amplifier, specifically of the integrated type, is either part of a single monolithically integrated device or, preferably, a separate circuit element.

As is well known, operational amplifiers are circuit elements of fundamental importance to electronic circuits, and are widely used in a variety of applications.

The most common construction of an operational amplifier basically comprises two serially connected stages, namely a transconductance input stage and an amplifier output stage.

In applications, an external feedback circuit is often provided to couple at least one output of the amplifier to an input thereof.

A frequency-oriented analysis of the transfer function of the amplifier 1, that is of the mathematical law that governs the relationship between the input and output signals, enables the frequency-wise behavior and stability of the fed-back amplifier to be determined. For the purpose, it is necessary to consider the transfer function G(s), where s is the complex variable. By transfer function, we mean here the modulo of the transfer function, for which the term gain or transfer ratio will be used as being more appropriate. Reference will be made hereinafter to open-loop transfer functions, that is having no external feedback, as denoted by $G_{ol}(s)$, and to closed-loop functions G.

In connection with the stability problems of fed-back circuits, it is generally necessary at the designing stage that attention be paid to possible problems of frequency response therefrom. The need for the fed-back amplifier to be a stable one, even at high frequencies and regardless of the external feedback, means in particular that an open-loop transfer function with suitably located poles and zeroes must be provided.

It should be considered that the transfer function has a certain number of poles at certain frequencies, mainly due the presence of capacitances. With an operational amplifier, these are primarily parasitic capacitances internal to the circuit and loads connected to the amplifier output.

The effects of a pole are, on one hand, a lowering circuit gain from its frequency value at a constant rate of decrease, and on the other hand, the introduction of a phase shift, that is a phase change in the transfer function. Furthermore, an interaction with following poles enhances the effect on gain from the individual pole.

FIG. 1a shows, in decibels (dB) and on a log scale, the open-loop gain pattern for an ideal operational amplifier as a function of the frequency f.

Only the two main poles of the transfer function are shown for the amplifier, namely a first or dominant pole p1 at a low frequency f1 and a second or non-dominant pole p2 at a high frequency f2.

As can be seen, the non-dominant pole p2 locates here at gain values of less than one in modulo. A closed-loop configuration, that is the case of the feedback loop being closed, will be considered. With a closed-loop gain $G_{cl}$ of unity value, i.e. $G_{cl}=0$ dB, the corresponding frequency defined by the intersection of the open-loop function $G_{ol}$ with the frequency axis, the so-called cutoff frequency, precedes the frequency f2 that corresponds to the non-dominant pole p2. If, as in the ideal case illustrated, the frequency f2 is sufficiently higher than the frequency $f_t$, the phase φ of the closed-loop transfer function is amply less than 180°. This ensures the stability of the fed-back system, in conformity with Bode's criterion for phase and gain.

However, open-loop transfer functions usually exhibit the behavior shown in FIG. 1b, which is typical of an unstable fed-back system. Notice that the frequency f2, corresponding to the second pole, is in fact lower than the cutoff frequency $f_t$ of the open-loop gain function $G_{ol}$. Thus, the combined effects of the two poles resulting, after the second pole, in a doubled rate of gain decrease and combined phase shifts, are felt before the gain value $G_{ol}$ has dropped down to unity. Accordingly, the fed-back system with gain close to one has a limited phase margin from 180°.

The presence of further poles, not shown, at a higher frequency contributes toward making the fed-back amplifier even more unstable because of the phase margin being still more restricted.

In the prior art, to obtain a desired pattern for the open-loop transfer function, to effectively ensure the amplifier stability in the fed-back configuration, so-called compensation techniques have been used. These allow the pole locations to be altered so as to bring the function profile close to that shown in FIG. 1a.

A compensation circuit, commonly consisting of a compensation capacitor, is introduced for the purpose, which allows at least one of the main poles to be shifted in frequency so as to re-locate it. The publication "The Monolithic Op Amp: a Tutorial Study", IEEE Solid-State Circuits, Vol. SC-9, December 1974, pages 314–332, which is hereby incorporated by reference, provides a detailed description of that technique.

The compensation circuit may either be provided outside the device or inside the amplifier.

A typical arrangement for an operational amplifier with compensation is shown in FIG. 2.

As previously mentioned, the amplifier, generally shown at 1, comprises two blocks placed serially between an input terminal IN and an output terminal OUT: an input stage 2 and an output stage 3. The blocks 2 and 3 provide amplifications $-A1(f)$ and $-A2(f)$, respectively, which are functions of the frequency f.

For the purpose of frequency compensation, the operational amplifier further includes a compensation block 4 connected between the input and the output of output stage 3.

As shown in the figure, compensation block 4 consists in practice of a capacitive element $C_C$, typically a capacitor having a capacitance in the range of a few pF to a few tens of pF, when internal, and of about 100 pF when external. This capacitor is adapted to control the value of the dominant pole, and possibly of the following poles in certain circuit configurations of the amplifier. Basically, the compensation capacitor $C_C$ connected to the intermediate node S between the input and output stages, will vary the actual capacitance as seen from the aforementioned node, which is material to the determination of the main pole locations.

Among the most widely used compensation techniques are the so-called dominant pole ones, which provide for a downward shift of one pole to make it dominant, thereby allowing the gain to attain a unity value while the other poles are still ineffective, and the pole splitting techniques which utilize Miller's Effect. The effect of this technique on the transfer function is indeed a splitting one, that is of moving the poles, specifically the two main poles, away from each other. Accordingly, the transfer function will take, following compensation, a similar pattern to that shown in FIG. 1a.

Known in the art are several embodiments of frequency-compensated operational amplifiers using a variety of technologies of both the MOS type, such as CMOS, NMOS or PMOS, and the bipolar type.

An operational amplifier compensated by conventional techniques of the kind just described has, however, certain drawbacks. Let us consider in particular, applications wherein the amplifier is to operate with different feedbacks, or wherein the closed-loop gain is not predetermined univocally, due to fluctuations in the working parameters during its operation. Let us take, for example, the instance of electrical systems having discrete elements, wherein the operational amplifier forms a circuit by itself, useful in applications of the audio or telephone type where the feedback can be selected by the user. Also, in a fully integrated device, let us consider the utilization of so-called variable-gain operational amplifiers.

Once the amplifier is designed and fabricated with preset compensation, and therefore, with the open-loop transfer function of the amplifier predetermined, the choice of the fed-back amplifier gain, or closed-loop gain, as determined by the external feedback and essentially by the resistance value applied in the feedback loop as previously explained, is restricted to a relatively narrow range of values.

It should be borne in mind, in this respect, that in the design of fed-back operational amplifiers, special care is taken to maximize the width of the frequency band wherein the amplifier operates properly and is stable. The selection of certain closed-loop gain values clashes with the requirements for stability and a wide frequency response of the amplifier.

To make this concept more easily understood, two discrete values of closed-loop gain for an amplifier having a predetermined compensation have been shown in FIG. 3a. In FIG. 3b, the same gain values are shown for an amplifier having no compensation or having reduced compensation with respect to the other figure. The numerical gain values are denoted by G1 and G2, with G1>G2 and G2 close to one. The respective frequencies at which the open-loop gain function is cut off are referenced f1a and f2a in FIG. 3a, and f1b and f2b in FIG. 3b. Also shown at f1', f2' and f1, f2 are the frequencies of the main poles.

Where the feedback determines gain values G2 close to one, such as where the fed-back amplifier is configured as a follower, only the compensated amplifier is stable. To have matters better understood, the gain axis should be visualized as shifted to the gain value G2. The frequencies f2a and f2b would then become the cutoff frequencies. Since the frequency f2a precedes the frequency f2' of the non-dominant pole, i.e. f2a=$f_t$<f2', the compensated amplifier will be stable, as explained hereinabove. The frequency f2b lies instead above the cutoff frequency, i.e. f2b=$f_t$>f2, with attendant loss of stability for the uncompensated amplifier.

On the other hand, where a particular application requires a high gain, this adversely affects the width of the frequency response. As can be gathered from a comparison of the two figures, for a gain of G1, the width of the response frequency band is too narrow at the higher frequencies, where compensation is used, and is wider for an amplifier with little compensation. It can be seen, in fact, that f1a is significantly less than f1b.

Thus, depending on the particular compensation applied, for a particular choice of gain, one can incur stability problems, on the one side, and excessive constraint on the band and consequent loss of speed, on the other.

This problem is obviated in discrete element systems by using an external compensation capacitor which can be plugged in by the user according to the closed-loop gain value selected.

One underlying technical problem addressed by this disclosure is to provide an operational amplifier which is frequency-adjustable for optimum performance in terms of speed of response and stability of the fed-back amplifier.

In particular, one object of this invention is to provide an operational amplifier with monolithically integratable compensation.

Furthermore, the amplifier should be uniquely versatile, and connectable by the user in a variety of systems, such as programmable systems.

PARTICULAR INNOVATIVE EMBODIMENTS

An operational amplifier with adjustable frequency compensation, preferably an integrated one, comprises a transconductance input stage and an amplifier output stage connected serially together between an input terminal and an output terminal of the operational amplifier. For the purpose of frequency compensation, moreover, a compensation block is connected across the input and the output of the output stage.

According to the preferred embodiment, the compensation block comprises a plurality of charge storage elements connected in parallel together and in series to a switch block which selects a sub-plurality of said charge storage elements on the basis of an external signal of the amplifier. The selected charge storage elements jointly provide an overall effective capacitance for frequency compensation.

In essence, for frequency compensation, the output terminal is connected to the input terminal of the amplifier by a feedback network which provides a closed-loop gain value and the external signal generated by a logic circuit which also sets the closed-loop gain value. The value of the overall effective capacitance is caused to vary according to the gain value, and is in particular an inverse function of the gain value.

In practical embodiments, the charge storage elements comprise compensation capacitors. Advantageously, the preferred embodiment is useful with conventional compensation techniques, such as techniques of the Miller type.

The innovative disclosures of this application can be applied to systems wherein gain is neither predetermined nor predeterminable.

According to the disclosed embodiments, the technical problem is solved by an operational amplifier with adjustable frequency compensation of the type described previously and defined in the claims.

The features and advantages of an operational amplifier according to this invention will be apparent from the description of embodiments thereof given by way of example and not of limitation with reference to the accompanying drawings.

BRIEF DESCRIPTION OF THE DRAWING

The disclosed inventions will be described with reference to the accompanying drawings, which show important sample embodiments of the invention and which are incorporated in the specification hereof by reference, wherein.

In the drawings.

DETAILED DESCRIPTION OF THE PREFERRED EMBODIMENTS

Figure 1A:
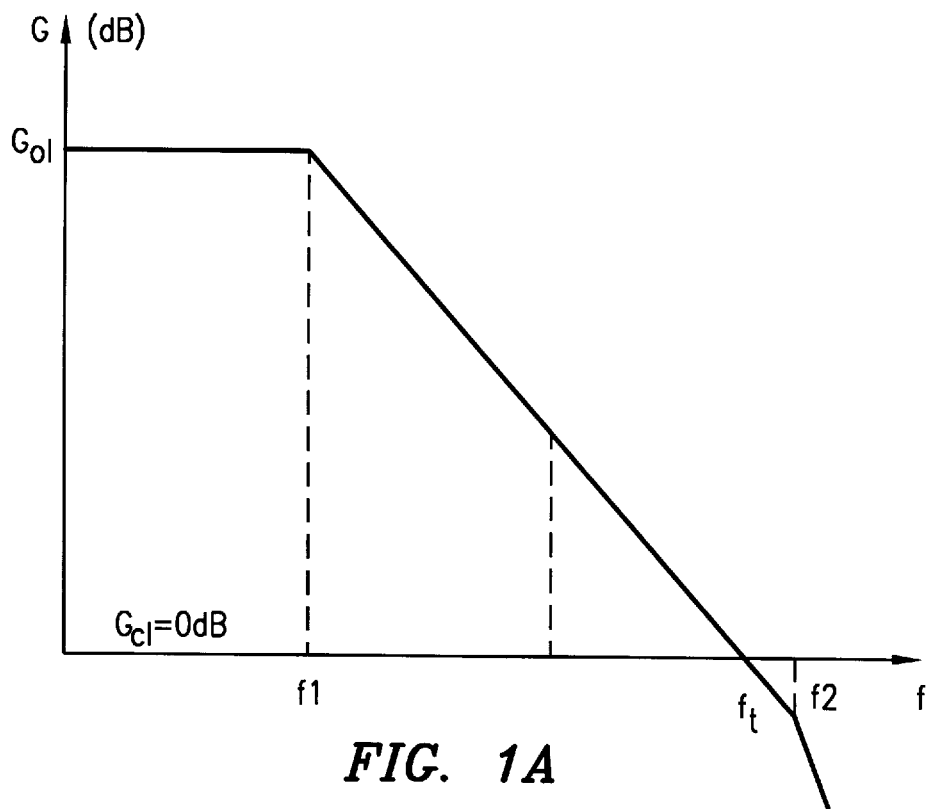
FIGS. 1a and 1b illustrate the open-loop gain function for a frequency-stable amplifier and an amplifier which has instability at the high frequencies, respectively.
Figure 1B:
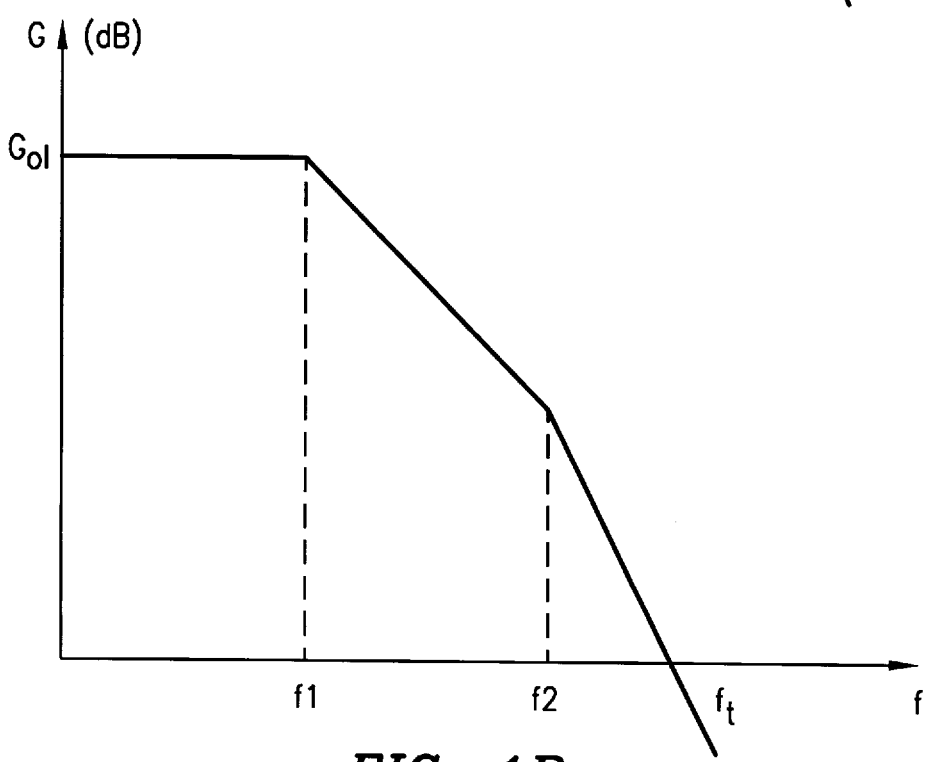
Figure 2:
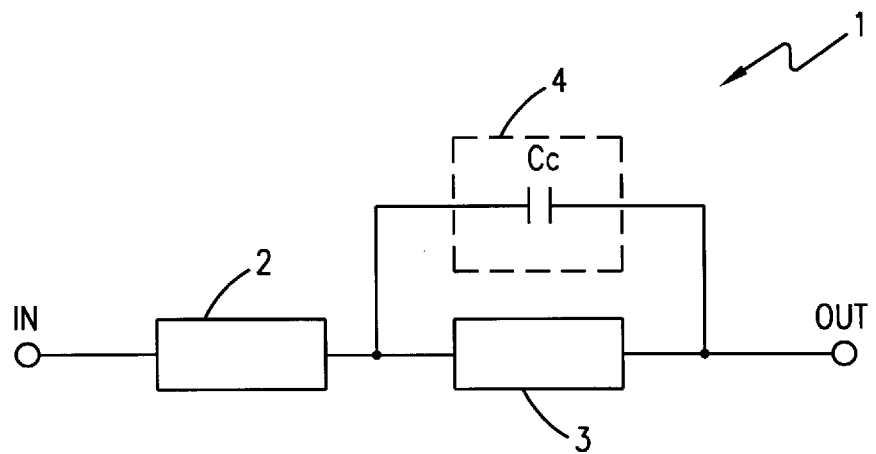
FIG. 2 is a block diagram of a frequency compensated operational amplifier according to the prior art.
Figure 4:
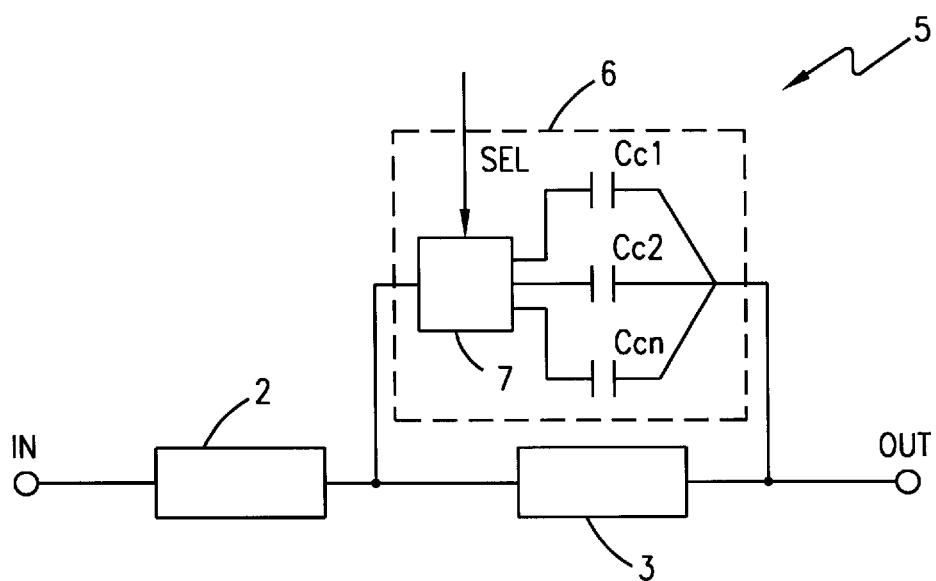
FIG. 4 is a block diagram of an operational amplifier with adjustable compensation according to this invention.
Figure 3A:
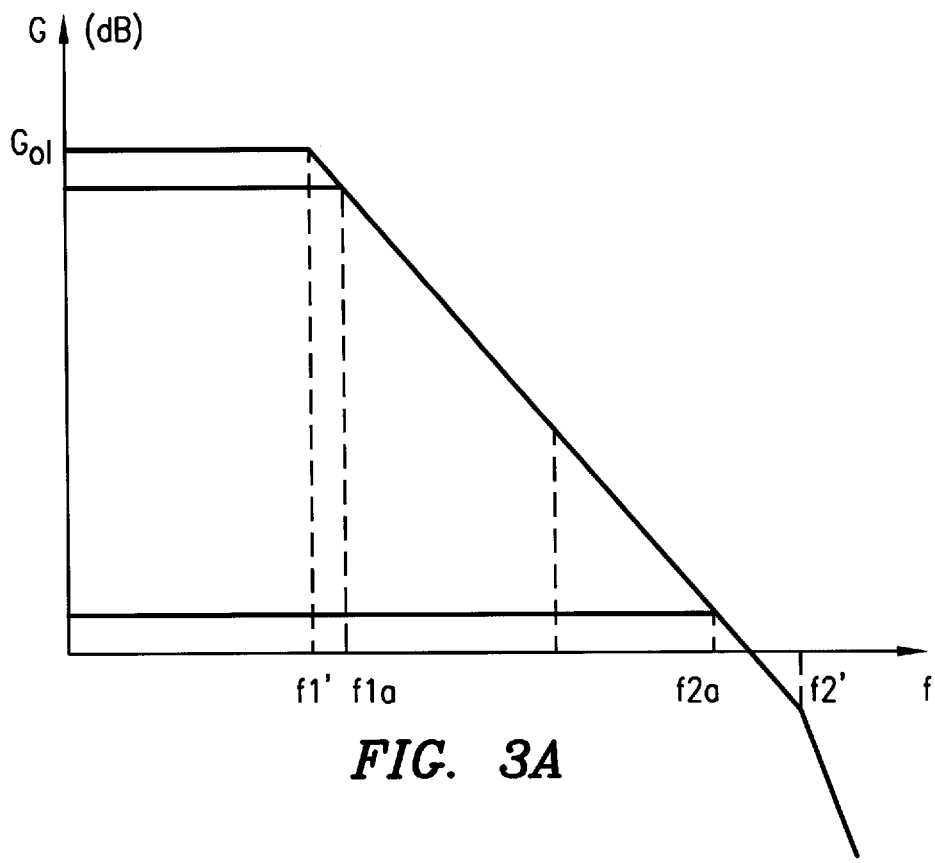
FIGS. 3a and 3b illustrate, in terms of closed-loop gain, the drawbacks of the conventional operational amplifiers previously described, at two different compensation values.
Figure 3B:
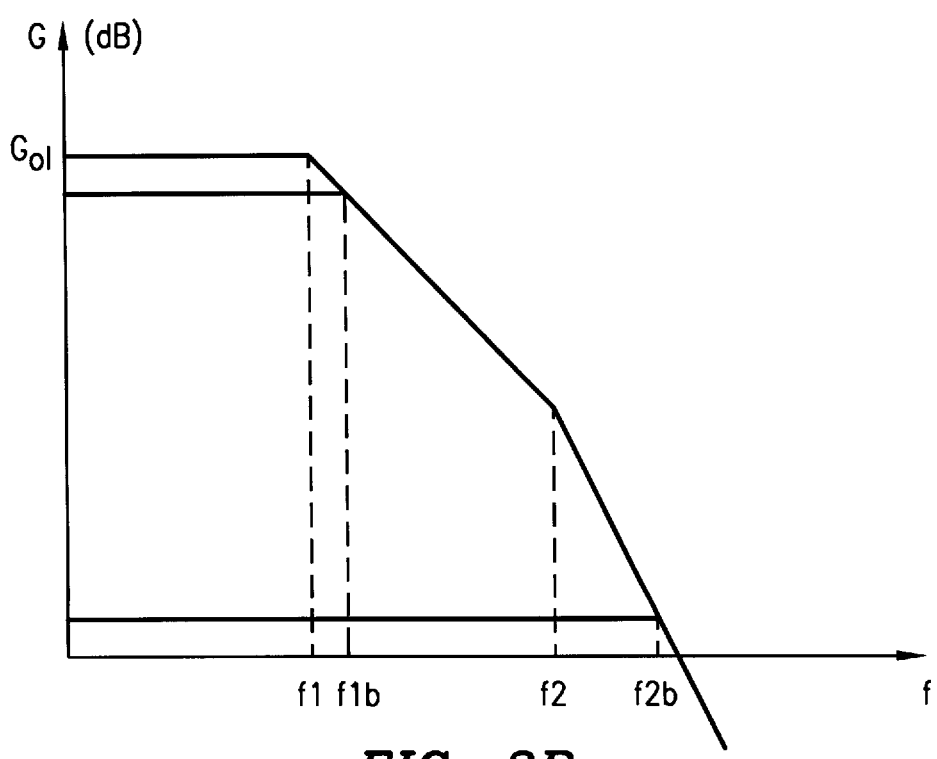

The numerous innovative teachings of the present application will be described with particular reference to the presently preferred embodiment (by way of example, and not of limitation), in which:

Referring to FIG. 4, generally and schematically shown at 5 is an operational amplifier according to a preferred embodiment. Corresponding blocks and elements are denoted by the same references as used in the preceding figure relating to the prior art. Preferably, the operational amplifier is monolithically integrated.

The amplifier comprises, similar to the conventional construction previously discussed, a transconductance input stage 2 and an amplifier output stage 3, connected serially with each other between at least one input terminal IN and an output terminal OUT. Preferably, the input stage 2 is a differential type comprising a differential pair of input transistors, for example. The amplification factor $-A1(f)$ shown indicates how much the input signal to the input stage 2 is amplified at the stage output, as a function of frequency. The output stage 3 is a gain stage having an amplification factor $A2(f)$ and, preferably, an active gain element, such as a transistor, as explained hereinafter in connection with an exemplary embodiment.

To provide frequency compensation, a compensation block 6 is connected across the input and the output of the output stage 3, that is across the output terminal OUT and an intermediate node between the two stages 2, 3 of the amplifier.

According to the preferred embodiment, the compensation block 6 comprises a plurality of charge storage elements which are, of preference, compensation capacitors. Shown by way of example in FIG. 4 are capacitors $C_{C1}$, $C_{C2}$, $C_{CN}$. The number N of the compensation capacitors may be of a few units. The compensation capacitors $C_{Cn}$ are connected in parallel with one another and in series with a switch block 7. In particular, as shown in the figure, one terminal of the capacitors $C_{Cn}$ is connected to the output terminal OUT of the amplifier, and the other terminal to a first terminal of the switch block 7. A second terminal of the block 7 is connected to the input of the output stage 3. However, the layout of the capacitors and the block 7 could be reversed from that shown in the figure, so as to have said unconnected terminal of the compensation capacitors $C_{Cn}$ to the switch connected to the input of the output stage 3.

Each compensation capacitor provides a compensation-effective capacitance value. This value may be the same or different for each capacitor.

The switch block functions to select, based on a signal SEL, a sub-plurality N' of charge storage elements $C_{Cn}$ and selectively connects them in parallel across the input and the output of the output stage 3. The signal SEL is actually generated outside the circuit of the amplifier 5.

The selected charge storage elements $C_{Cn}$ provide a combined effective capacitance Ctot for frequency compensation purposes.

Where, for example, the effective capacitances of the individual elements $C_{Cn}$ are all different, the switch block may select a single element having a predetermined effective capacitance. In this case, the overall capacitance will be determined by the specific element selected. Where the effective capacitance is the same for all elements, the overall compensation-effective capacitance will be dependent on a factor N', that is on the number of the selected capacitors. In general, a certain number of capacitors would be selected some of which may have the same value.

The frequency compensation of an amplifier according to the preferred embodiment may be varied to advantage. In essence, for frequency compensation, assume that the output terminal OUT of the amplifier 5 is feedback connected to the input terminal IN by a feedback network setting a value of $G_{cl}$ for the closed-loop gain. The external signal SEL that controls the selection of the charge storage elements can be varied to suit this closed-loop gain value. Advantageously, the external signal SEL may be generated by a logic circuit which also sets the gain value. The overall effective capacitance value is preferably made to vary according to the gain value $G_{cl}$, it being in particular an inverse function of the gain value.

The variable compensation effect with feedback according to the preferred embodiment is obtained by changing the value of the effective compensation capacitance. It should be borne in mind that the variation in compensation corresponds to a shift in the cutoff frequency ft. Since the cutoff pulsation $w_t$ is proportional to the cutoff frequency ft but for the factor 2P, and given by $w_t = g_{mi}/C_C$, in order to vary, for instance increase, the cutoff frequency, either the transconductance $g_{mi}$ of the input stage may be increased or the compensation capacitance decreased.

Figure 5:
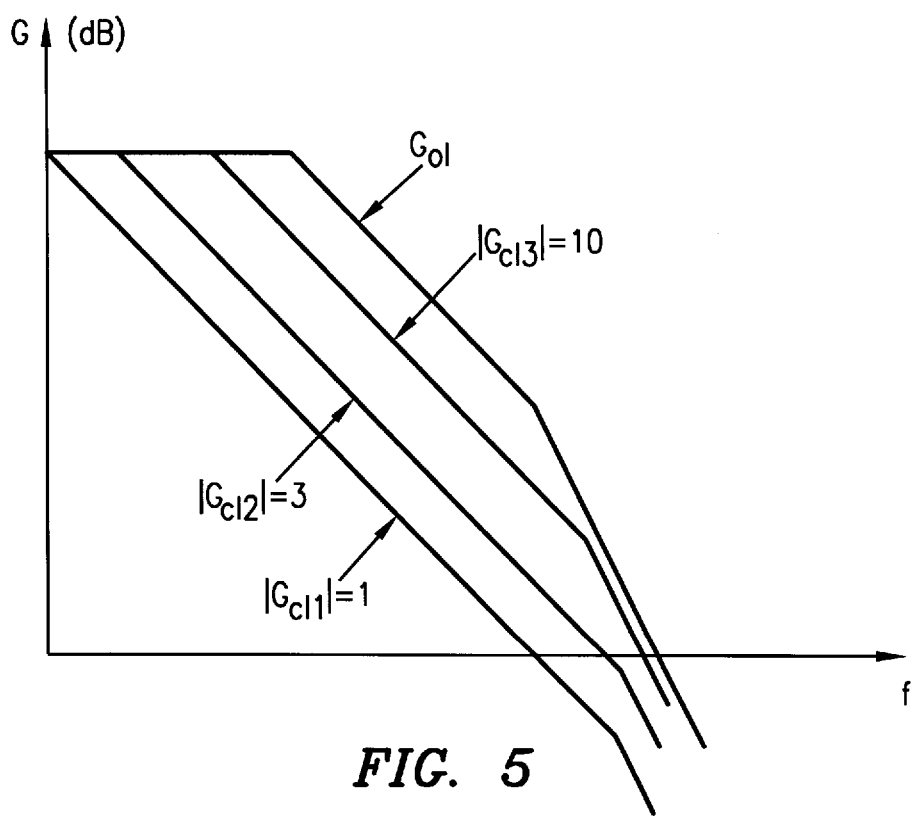
FIG. 5 illustrates the regulating effect of the compensation according to the invention.

The outcome of the preferred variation in the compensation capacitance that provides a variable compensation is shown in FIG. 5.

Shown are the open-loop gain functions for both the case, designated $G_{ol}$, where no feedback is provided and the case where a few different feedbacks are applied which may be identified by the corresponding closed-loop gain value Gcl. By way of example, the open-loop gain functions corresponding to three different feedbacks are compared, in absolute value on a log scale, for gain values $G_{cl1}$, $G_{cl2}$, $G_{cl3}$, of 1, 3 and 10, respectively.

Where no resistance is applied to the feedback, that is the output is shorted to the input, as is the case with the follower, then the gain is zero and the compensation selected at a maximum. Although the pass band is relatively narrow, stable operation of the fed-back amplifier is ensured. Conversely, for a high gain, extreme with the open loop, the overall effective compensation capacitance is selected at a low value.

This allows a very high compensation band to be maintained, and therefore, the prior art problems described to be overcome. Thus, a sufficient bandwidth is ensured for each feedback selected. Advantageously, this also affords a high rate of amplifier frequency response for each operating condition.

It should be borne in mind that each capacitor could be replaced with a different charge storage element or combination of different capacitive elements.

The effective capacitance values, according to preferred embodiments of the invention, may be in the range of a few tens of pF.

Preferably, the switch block 7 comprises a plurality N of switches In, each connected in series with a respective charge storage element $C_{Cn}$.

Figure 6:
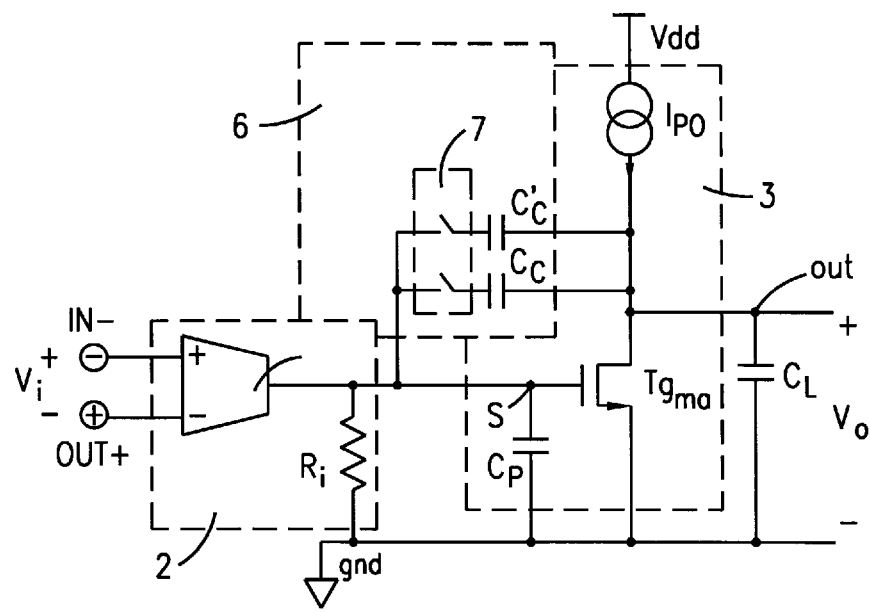
FIG. 6 shows an embodiment of an operational amplifier according to the invention using a Miller type of compensation.

A circuit diagram of an operational amplifier 5 according to the preferred embodiment will now be described with reference to FIG. 6 for a pole-splitting type of compensation. The circuit is based on Miller's compensation principle.

The following example relates in particular to circuits made with MOS, preferably CMOS, technology. Alternatively, the amplifier 5 could be made with an NMOS or PMOS technology, or a bipolar technology.

First and second input terminals, IN– and IN+, represent inverting and non-inverting terminals, respectively, of the amplifier. An output terminal is designated OUT. The amplifier 5 input is connected to a transconductance block 8 which has a transconductance gmi and forms the input stage 2, preferably of the differential type. The output stage 3 has on its input an output transistor $Tg_{mo}$ of the NMOS type.

The transconductance block 8 has a pair of input terminals "+" and "–" connected to the amplifier input terminals IN– and IN+, respectively, and an output terminal connected to an intermediate node S. Its equivalent output resistor, designated $r_i$, is shown connected to the output of the block 8. The output transistor $Tg_{mo}$ is connected in a common-source configuration with its source terminal to the ground terminal GND. Its drain terminal is connected directly to the output terminal OUT and to an output current generator $I_{PO}$ which forces a current flow through the transistor. The operation of the transistor $Tg_{mo}$ is controlled through a gate terminal connected to the intermediate node S, between the input stage 2 and the output stage 3. Of course, the output transistor $Tg_{mo}$ could be replaced with an equivalent active gain element serving the same amplification function.

The compensation block 6 comprises a pair of compensation capacitors $C_C$ and $C_C'$. Although two compensation capacitors have been shown by way of example, a larger number N could be provided. In all cases, the compensation capacitors are connected in parallel between the drain of $Tg_{mo}$ and the intermediate node S. Connected in series with each compensation capacitor is a switch In which functions to allow the respective capacitor to be selected when in the closed state. Each switch is controlled by a control signal SELn, not shown in the figure, outside the circuit. In practice, the selected capacitor(s) will determine the actual compensation capacitance, and hence the pattern of the transfer function. The extent of the compensation provided can thus be varied.

According to the preferred embodiment, therefore, the compensation value can be controlled for optimum performance both in terms of speed of response and stability of the fed-back amplifier, for any gain values.

The operational amplifier may include an additional amplifier power stage connected across the gain output stage and the output terminal.

It will be appreciated that many changes and modifications may be made unto the operational amplifier, frequency self-compensated with respect to closed-loop gain, described above within the scope of the invention as defined in the following claims.

According to a disclosed class of innovative embodiments, there is provided an operational amplifier, comprising: a transconductor stage connected in series with an amplifier stage, said transconductor stage having at least one op-amp input terminal and said amplifier stage having at least one op-amp output terminal; a compensation block connected in parallel with said amplifier stage; wherein said compensation block provides a capacitance which allows variable frequency compensation.

According to another disclosed class of innovative embodiments, there is provided an operational amplifier, comprising: a transconductor stage connected in series with an amplifier stage, said transconductor stage having at least one op-amp input terminal and said amplifier stage having at least one op-amp output terminal; a compensation block connected in parallel with said amplifier stage, comprising a switching circuit, and a plurality of circuit elements connected in series with said switching circuit; wherein said switching circuit is connected to activate at least one of said elements to provide a capacitance which allows variable frequency compensation.

According to another disclosed class of innovative embodiments, there is provided an operational amplifier, comprising: a transconductor stage having first and second input terminals; an output transistor having a control terminal operatively connected to an output of said transconductor stage, a first current-carrying terminal connected to a current source, and a second current-carrying terminal connected to a reference potential, said first and second current-carrying terminals being connected to first and second output terminals of said amplifier; and a plurality of capacitive elements, each connected to a switching circuit, connected in parallel between said control terminal and said first current-carrying terminal.

According to another disclosed class of innovative embodiments, there is provided an operational amplifier with adjustable frequency compensation, of the type which comprises a transconductance input stage and an amplifier output stage connected serially with each other between an input terminal and an output terminal of the operational amplifier, and at least one compensation block connected across the input and the output of said output stage, characterized in that said compensation block comprises a plurality of charge storage elements connected together in parallel and in series to a switch block which selectively connects a sub-plurality of said charge storage elements across the input and the output of said output stage on the basis of a signal external to the amplifier.

The following background publications provide additional detail regarding possible implementations of the disclosed embodiments, and of modifications and variations thereof. All of these publications are hereby incorporated by reference: the ANALOG CIRCUIT DESIGN SEMINAR books published by Analog Devices; ANALOG CIRCUIT DESIGN (ed. J. Williams 1991); *Analog Dialogue* from 1980 to date; Collins, ANALOG ELECTRONICS HANDBOOK (1989); Coughlin and Driscoll, OP AMPS AND LINEAR INTEGRATED CIRCUITS 3.ed. (1991); Davidse, INTEGRATION OF ANALOGUE ELECTRONIC CIRCUITS; Feucht, HANDBOOK OF ANALOG CIRCUIT DESIGN (1990); Geiger et al., VLSI DESIGN TECHNIQUES FOR ANALOG AND DIGITAL CIRCUITS; Gray & Meyer, ANALYSIS & DESIGN OF ANALOG INTEGRATED CIRCUITS (2.ed. 1983 and 3.ed. 1993); Grebene, BIPOLAR & MOS ANALOG IC DESIGN (1984); Haskard and May, ANALOG VLSI DESIGN (1987); L. P. Huelsman, and P. E. Allen, INTRODUCTION TO THE THEORY AND DESIGN OF ACTIVE FILTERS (1980); Moschytz, LINEAR INTEGRATED NETWORKS: DESIGN (1975); Moschytz, LINEAR INTEGRATED NETWORKS: FUNDAMENTALS (1974); Pease, TROUBLESHOOTING ANALOG CIRCUITS; Schaumann et al., DESIGN OF ANALOG FILTERS (1990); J. Scott, ANALOG ELECTRONIC DESIGN (1991); Soclof, "Design and Applications of Analog Integrated Circuits"; Toumazou et al., ANALOGUE IC DESIGN: THE CURRENT-MODE APPROACH; Van Valkenburg, ANALOG FILTER DESIGN (1982); Thomas Young, LINEAR INTEGRATED CIRCUITS (1981).

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, within the constraints well-known to those of ordinary skill, nonlinear devices can be added in series with (or used to replace) resistors, to increase the impedance of load devices.

What is claimed is:

1. An operational amplifier, comprising:
   a transconductor stage connected in series with an amplifier stage, said transconductor stage having at least one op-amp input terminal and said amplifier stage having at least one op-amp output terminal;
   a compensation block connected in parallel with said amplifier stage;
   wherein said compensation block comprises a plurality of compensation capacitors and provides a capacitance which allows variable frequency compensation; and
   wherein said plurality of compensation capacitors are selectively switched to provide an overall effective capacitance for frequency compensation; and
   wherein said switching is controlled by an external signal; and
   wherein said external signal controlling the selection of said compensation capacitors varies with a closed-loop gain value determined by an external feedback network applied between the output and input of the operational amplifier.

2. The operational amplifier of claim 1, wherein each of said selected compensation capacitors provides a different effective capacitance, and said switching selects a single compensation capacitor having a predetermined effective capacitance.

3. The operational amplifier of claim 1, wherein each of said compensation capacitors provides the same effective capacitance value.

4. The operational amplifier of claim 1, wherein said amplifier is made with CMOS technology.

5. An operational amplifier, comprising:
   a transconductor stage connected in series with an amplifier stage, said transconductor stage having at least one op-amp input terminal and said amplifier stage having at least one op-amp output terminal;
   a compensation block connected in parallel with said amplifier stage, comprising:
   a switching circuit, and
   a plurality of circuit elements connected in series with said switching circuit;
   wherein said switching circuit is connected to activate at least one of said elements to provide a capacitance which allows variable frequency compensation; and
   wherein said switching circuit is controlled by an external signal; and
   wherein said external signal controlling the selection of said capacitative elements is variable of a closed-loop gain value determined by an external feedback network applied between said output and input terminals of the operational amplifier.

6. The operational amplifier of claim 5, wherein said circuit elements comprise compensation capacitors.

7. The operational amplifier of claim 5, wherein said plurality of circuit elements are selectively switched to provide an overall effective capacitance for frequency compensation.

8. The operational amplifier of claim 5, wherein each of said activated circuit elements provides a different effective capacitance, and said switching circuit selects a single circuit element having a predetermined effective capacitance.

9. The operational amplifier of claim 5, wherein each of said circuit elements provide the same effective capacitance value.

10. The operational amplifier of claim 5, wherein said amplifier is made with CMOS technology.

11. An operational amplifier, comprising:
    a transconductor stage having first and second input terminals;
    an output transistor having a control terminal operatively connected to an output of said transconductor stage, a first current-carrying terminal connected to a current source, and a second current-carrying terminal connected to a reference potential, said first and second current-carrying terminals being connected to first and second output terminals of said amplifier; and
    a plurality of capacitive elements, each connected to a switching circuit, connected in parallel between said control terminal and said first current-carrying terminal; and
    wherein said switching circuits are controlled by an external signal; and
    wherein said external signal controlling the selection of said capacitative elements is variable of a closed-loop gain value determined by an external feedback network applied between said output and input terminals of the operational amplifier.

12. The operational amplifier of claim 11, wherein said plurality of capacitative elements are selectively switched to provide an overall effective capacitance for frequency compensation.

13. The operational amplifier of claim 11, wherein each of said selected capacitative elements provides a different effective capacitance, and said switches select a single capacitative element having a predetermined effective capacitance.

14. The operational amplifier of claim 11, wherein each of said capacitative elements provides the same effective capacitance value.

15. The operational amplifier of claim 11, wherein said switches are each connected in series with a respective one of the capacitative elements.

16. The operational amplifier of claim 11, wherein said amplifier is made with CMOS technology.

17. An operational amplifier with adjustable frequency compensation, of the type which comprises a transconductance input stage and an amplifier output stage connected serially with each other between an input terminal and an output terminal of the operational amplifier, and at least one compensation block connected across the input and the output of said output stage, characterized in that said compensation block comprises a plurality of charge storage elements connected together in parallel and in series to a switch block which selectively connects a sub-plurality of said charge storage elements across the input and the output of said output stage on the basis of a signal external to the amplifier; and wherein said sub-plurality of selected charge storage elements provide an overall effective capacitance for frequency compensation; and wherein said external signal controlling the selection of said sub-plurality of charge storage elements is variable according to a closed-loop gain value determined by an external feedback network applied between said output and input terminals of the operational amplifier.

18. An operational amplifier according to claim 17, characterized in that each of said selected charge storage elements provides a different effective capacitance, and said switch block selects a single charge storage element having a predetermined effective capacitance.

19. An operational amplifier according to claim 17, characterized in that said charge storage elements provide the same effective capacitance value.

20. An operational amplifier according to claim 17, characterized in that said charge storage elements comprise compensation capacitors.

21. An operational amplifier according to claim 17, characterized in that said switch block comprises a plurality of switches, each connected in series with a respective one of the charge storage elements.

22. An operational amplifier according to claim 17, characterized in that it is made with CMOS technology.

* * * * *